(12) United States Patent
Yokota

(10) Patent No.: US 6,477,700 B1
(45) Date of Patent: Nov. 5, 2002

(54) RETICLE HAVING DISCRIMINATIVE PATTERN NARROWER IN PITCH THAN THE MINIMUM PATTERN WIDTH BUT WIDER THAN MINIMUM WIDTH IN THE PATTERN RECOGNITION

(75) Inventor: Kazuki Yokota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/526,525

(22) Filed: Mar. 16, 2000

(30) Foreign Application Priority Data

Mar. 16, 1999 (JP) .......................................... 11-070325

(51) Int. Cl.⁷ ............................................. G06F 17/50
(52) U.S. Cl. ............................. 716/21; 716/1; 716/20; 716/21
(58) Field of Search ........................ 716/1–2, 8–11, 716/17–19, 20–21

(56) References Cited

U.S. PATENT DOCUMENTS

| 5,677,248 A | * | 10/1997 | Sakai et al. .................. 437/228 |
| 5,766,806 A | * | 6/1998 | Spence ........................... 430/5 |
| 5,786,113 A | * | 7/1998 | Hashimoto et al. ............. 430/5 |
| 5,792,596 A | * | 8/1998 | Yasuzato et al. ............. 430/327 |
| 6,064,477 A | * | 5/2000 | Matasumoto et al. ........ 356/237 |
| 6,130,750 A | * | 10/2000 | Ausschnitt et al. ......... 356/401 |
| 6,219,130 B1 | * | 4/2001 | Kawakubo ................... 355/67 |

FOREIGN PATENT DOCUMENTS

| JP | 62-219941 | 9/1987 |
| JP | 3-238455 | 10/1991 |
| JP | 10-90116 | 4/1998 |

OTHER PUBLICATIONS

Japanese Office Action dated Apr. 2, 2002, with partial English translation.

* cited by examiner

Primary Examiner—Vuthe Siek
Assistant Examiner—Granvill D Lee, Jr.
(74) Attorney, Agent, or Firm—McGinn & Gibb, PLLC

(57) ABSTRACT

A reticle has a main pattern to be transferred to a photo-sensitive layer and surrounded by a non-transparent layer, and a discriminative pattern loops in the non-transparent layer so as to define an area to be inspected for serious defects, wherein the discriminative pattern is implemented by plural non-transparent portions such as strips arranged at intervals less than the minimum width to be transferred at the maximum resolution of the reduction projection aligner; however, the discriminative pattern or the plural non-transparent portions occupy a looped area wider than a minimum width to be recognized by a pattern recognition system so that the discriminative pattern clearly defines the area to be inspected regardless of the resolution.

10 Claims, 2 Drawing Sheets

RETICLE HAVING DISCRIMINATIVE PATTERN NARROWER IN PITCH THAN THE MINIMUM PATTERN WIDTH BUT WIDER THAN MINIMUM WIDTH IN THE PATTERN RECOGNITION

FIELD OF THE INVENTION

This invention relates to a pattern transfer technology for fabricating a semiconductor device and, more particularly, to a reticle used in a reduction projection aligner.

DESCRIPTION OF THE RELATED ART

The reticle is a transparent glass plate, and a major surface of which is selectively covered with non-transparent metal film such as, for example, chromium. The reticle is broken down into a transparent portion and a non-transparent portion, and the boundary between the transparent portion and the non-transparent portion defines a pattern to be transferred to a photo-sensitive layer.

The pattern is formed in a central area of the major surface of the reticle, and the peripheral area around the pattern is covered with the non-transparent metal film. When a semiconductor device manufacturer transfers the pattern to a photo-resist layer spread over a semiconductor wafer, the reticle is mounted on a reticle stage in a reduction projection aligner, and is aligned with an optical path from a light source to the semiconductor wafer on a wafer stage. The reticle is illuminated with the light, and the image of the pattern is transferred from the reticle to the photo-resist layer so as to form a latent image in the photo-resist layer. Thus, the image is produced through the central area of the reticle.

If the reticle has pattern defects and/or pin-holes in the non-transparent metal film in the peripheral area, the defects are also transferred to the photo-resist layer, and the latent image contains images of defects. The latent image is developed, and the photo-resist layer is formed into a photo-resist mask on the semiconductor water. While the latent image is being developed, the images of the defects are influential in the pattern of the photo-resist mask. The photo-resist mask also contains the images of the defects. Using the deformed photo-resist mask, the images of the defects are further transferred to a semiconductor layer or an insulating layer under the photo-resist mask, and such a defect pattern is causative of a short-circuit or disconnection in an integrated circuit on the semiconductor chip. Thus, the defects on the reticle are transferred to the conductive/insulating pattern on the semiconductor wafer, and damages the integrated circuit on the semiconductor chip.

In order to prevent the conductive/insulating pattern of the integrated circuit from the images of the defects, the reticle is subjected to an inspection before the installation in the reduction projection aligner. If the inspection is carried out over the entire surface of the major surface, large amount of time and labor is consumed. The manufacture forms a slit 3 in the non-transparent metal film 2 in the peripheral area as shown in FIG. 1. Typical examples of the reticle formed with the slit 3 are disclosed in Japanese Patent Publication of Unexamined Application Nos. 62-219941 and 3-238455. The slit 3 loops around the pattern in the central area, and defines an area to be inspected. The manufacturer carries out the inspection inside the slit 3, and reduces the time and labor consumed for the inspection.

The slit 3 defines a pattern. If the slit pattern is transferred to the photo-resist layer, the slit pattern serves as a defect, and damages the integrated circuit. For this reason, it is necessary to design the slit 3 to have the width W2 narrower than the minimum width at the maximum resolution of the optical pattern transfer system on the photo-resist layer. However, the minimum width has been decreased. The minimum width is presently extremely narrow. This means that the width W2 is also extremely narrow. In this situation, the pattern recognition system hardly discriminates the slit 3 in the inspection.

SUMMARY OF THE INVENTION

It is therefore an important object of the present invention to provide a reticle, which has a pattern indicative of a boundary clearly recognized in the inspection.

To accomplish the object, the present invention proposes to form plural slits arranged at intervals narrower than the minimum width.

In accordance with one aspect of the present invention, there is provided a reticle used for a pattern transfer to a photo-sensitive layer comprising a transparent substrate having a major surface, a main pattern formed on the major surface, a non-transparent layer formed on the major surface outside of the main pattern and a discriminative pattern formed in the non-transparent layer for indicating a boundary of an area to be inspected for defects influential in a latent image to be formed in the photo-sensitive layer, having a width equal to or greater than a minimum width to be recognized by a pattern recognition means, and including plural portions arranged at intervals each less than a minimum width at a maximum resolution in a pattern transfer.

BRIEF DESCRIPTION OF THE DRAWINGS

The features and advantages of the reticle will be more clearly understood from the following description taken in conjunction with the accompanying drawings in which.

DESCRIPTION OF THE PREFERRED EMBODIMENTS

First Embodiment

Figure 2:
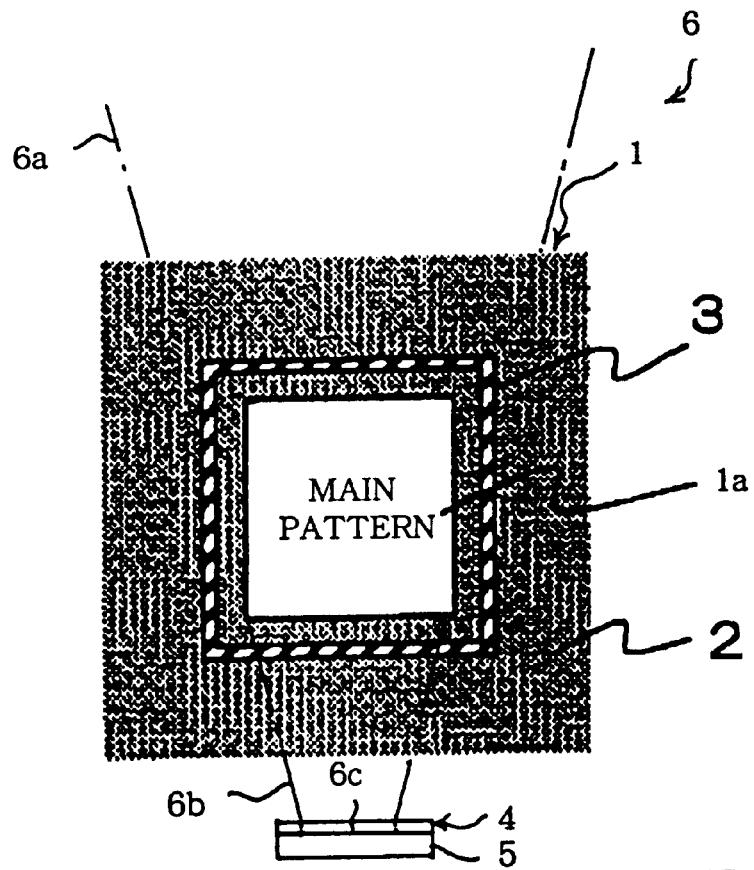
FIG. 2 is a schematic plane view showing a reticle according to the present invention.

Referring to FIG. 2 of the drawings, a reticle embodying the present invention largely comprises a transparent substrate 1 such as, for example, a glass substrate and a non-transparent layer 2 such as, for example, a non-transparent metal layer selectively formed on a major surface of the transparent substrate 1. The major surface has a central area and a peripheral area around the central area.

Though not shown in FIG. 2, the central area is selectively covered with part of the non-transparent layer 2, and defines a main pattern 1a to be transferred onto a photo-resist layer 4 formed on a semiconductor wafer 5.

When a manufacturer transfers the main pattern 1a to the photo-resist layer 4, the reticle is held by a reticle holder of a reduction projection aligner 6, and the semiconductor wafer 5 is mounted on a wafer holder of the reduction projection aligner 6. The wafer holder is moved in such a manner as to align the area of the photo-resist layer 4 with an optical path passing through the main pattern 1a.

The reticle is illuminated with a light beam 6a, and produces an image-carrying light 6b. The image-carrying light transfers the main pattern from the reticle to the photo-resist layer 4. The image-carrying light 6b is fallen onto the photo-resist layer 4, and forms a latent image 6c in the photo-resist layer 4.

The remaining part of the non-transparent layer 2 covers the peripheral area around the central area, and, accordingly, loops around the main pattern 1a as shown. A discriminative pattern 3 is formed in the remaining part of the non-transparent layer 2. The discriminative pattern 3 is located outside the inner periphery of the remaining part of the non-transparent layer 2, and loops therearound.

The discriminative pattern 3 is outwardly spaced from the outer periphery of the main pattern 1a, and the distance between the outer periphery and the discriminative pattern 3 is regulated in such a manner that a shading means in the reduction projection aligner only allows the light beam 6a to carry images inside the discriminative pattern 3.

Figure 3:
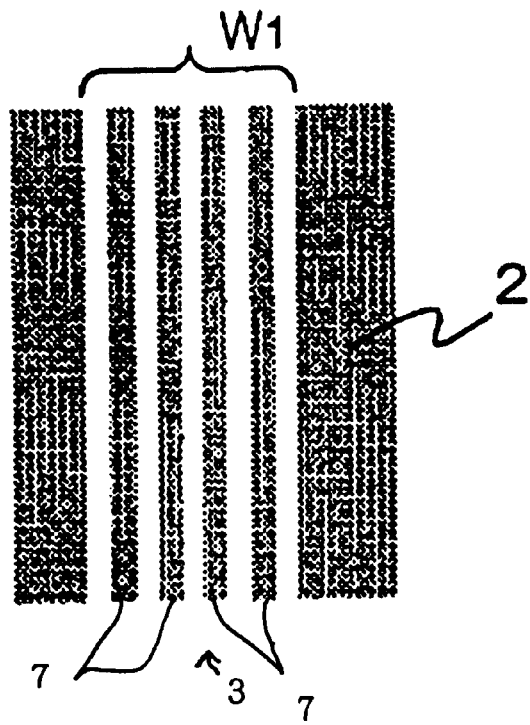
FIG. 3 is a plane view showing a part of a pattern indicative of a boundary for an inspection.

In this instance, the discriminative pattern 3 is implemented by non-transparent strips 7 arranged at intervals on the transparent substrate as shown in FIG. 3. Thus, the discriminative pattern 3 is a line-and-space pattern. The discriminative pattern 3 is indicative of a boundary for an inspection. The manufacturer checks the reticle to see whether or not serious defects are found in the inspection. The serious defects do not form a part of the main pattern, but and is transferred from the defects to the photo-resist layer. The serious defects are influential in the latent image 6c, and the images of the serious defects form parts of the latent image. An example of the serious detect is a pinhole formed in the non-transparent layer 2. The discriminative pattern 3 sets a limit on the area to be inspected, and enhances the efficiency of the inspection.

The transparent substrate 1 is exposed to the gaps between the non-transparent strips 7. Each of the gaps is narrower than the minimum width at the maximum resolution in the pattern transfer to the photo-resist layer 4. For this reason, even if the discriminative pattern is illuminated with stray light in the pattern transfer, the non-transparent strips 7 do not form any latent image in the photo-resist layer 4. Nevertheless, the discriminative pattern 3 is recognized by a pattern recognition system (not shown) such as, for example, an optical microscope, because the plural non-transparent strips 7 occupy a looped sub-area much wider than the minimum width. Moreover, the pattern recognition system discriminates the line-and-space pattern clearer than a single space pattern like the prior art reticle. Thus, the width W1 of the discriminative pattern 3 is much greater than the minimum width, and, accordingly, the area to be inspected is clearly defined by the discriminative pattern 3.

As will be understood from the foregoing description, the discriminative pattern 3 is implemented by the plural non-transparent strips 7. Although the intervals of the plural non-transparent strips 7 are narrow not to form any latent image in the photo-resist layer 4, the discriminative pattern 3 is wide enough to be recognized in the inspection. Even if the resolution is enhanced, the discriminative pattern is still recognized, and clearly gives the boundary of the area to be inspected.

In the first embodiment, the plural strips 7 serves as plural portions, and the spaces are corresponding to intervals.

Second Embodiment

Figure 4:
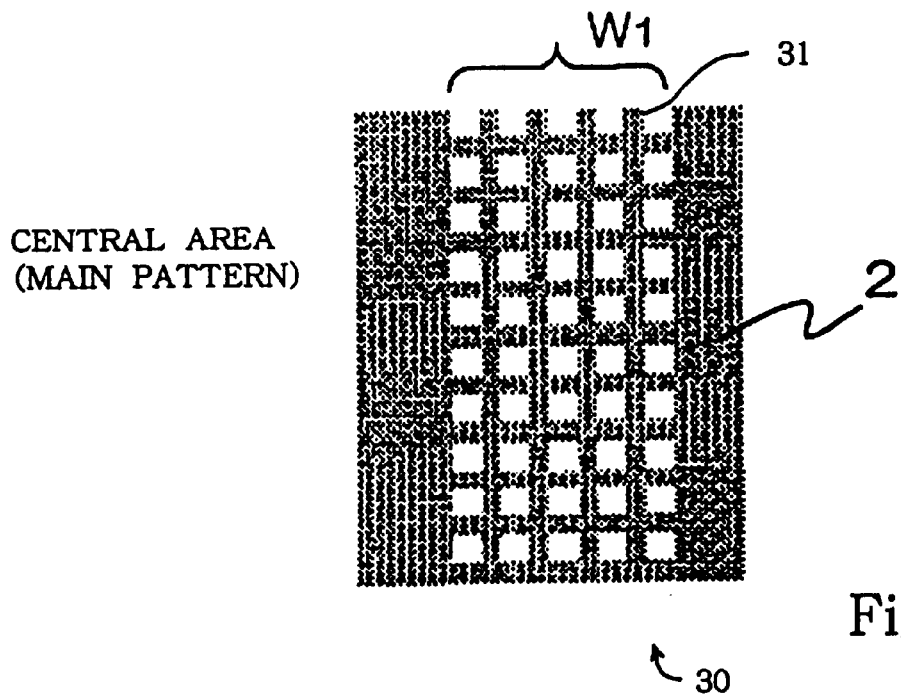
FIG. 4 is a plane view showing a part of another pattern indicative of a boundary for an inspection.
Figure 1:
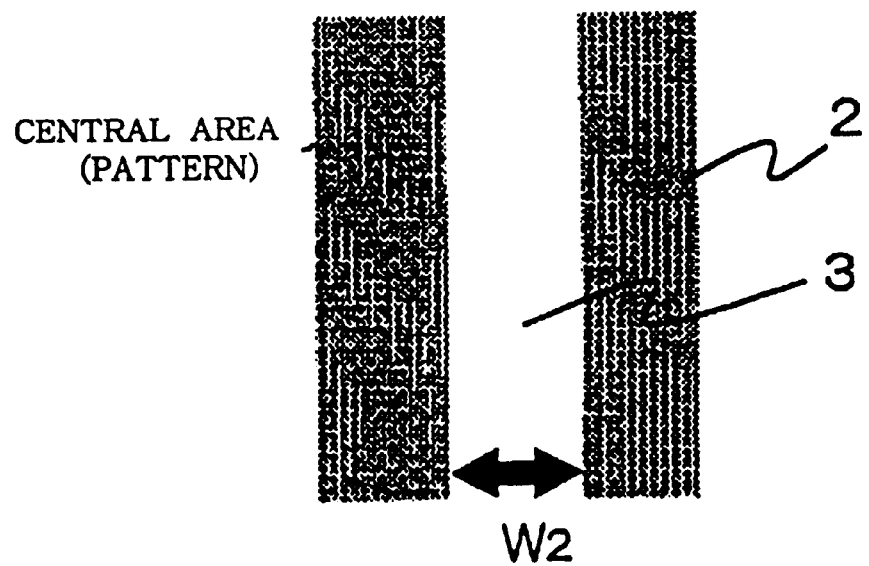
FIG. 1 is a plane view showing the slit formed in the peripheral area of the prior art reticle.

Turning to FIG. 4 of the drawings, a discriminative pattern 30 of another reticle embodying the present invention is implemented by a non-transparent lattice 31. The non-transparent lattice 31 is implemented by plural non-transparent bars two-dimensionally arranged on the transparent substrate 1. Other features of the reticle implementing the second embodiment are similar to corresponding features of the first embodiment. For this reason, description is hereinbelow focused on the discriminative pattern 30.

The discriminative pattern 30 has a lattice configuration. Square spaces are defined by the discriminative pattern 30, and the transparent substrate 1 is exposed to the square spaces. The two dimensions of each square space are less than the minimum width to be transferred to the photo-resist layer 4 at the maximum resolution of the reduction projection aligner 6. However, the discriminative pattern 30 has the width W1 equal to or greater than the minimum width to be recognized by a pattern recognition system (not shown) such as, for example, an optical microscope. For this reason, the discriminative pattern 30 does not form any latent image in the photo-resist layer 4, but is clearly discriminated in the inspection for the serious defects.

In the second embodiments, the non-transparent bars around the square spaces serve as portions.

As will be appreciated from the foregoing description, the discriminative pattern does not form a latent image, and is recognizable by a pattern recognition system. Even if the minimum pattern width is reduced, the manufacturer keeps the width of the discriminative pattern equal to or greater than the minimum width to be recognized, because the manufacturer increases the number of the portions of the pattern. Thus, the discriminative pattern clearly defines an area to be inspected regardless of the enhancement of the resolution in the pattern transfer.

Although particular embodiments of the present invention have been shown and described, it will be apparent to those skilled in the art that various changes and modifications may be made without departing from the spirit and scope of the present invention.

The discriminative pattern may be automatically recognized by a pattern recognition system with an image pick-up device associated with a data processing unit.

The discriminative pattern is never limited to the line-and-space pattern, not the lattice pattern. Another pattern such as dots may be used for the discriminative pattern.

It is necessary for the discriminative pattern to have reflectivity different from the transparent substrate. However, the reflectivity may not be equal to that of the non-transparent layer 2.

What is claimed is:

1. A reticle used for a pattern transfer to a photo-sensitive layer, comprising:

a transparent substrate having a major surface;

a main pattern formed on said major surface;

a non-transparent layer formed on said major surface outside of said main pattern; and a discriminative pattern formed in said non-transparent layer for indicating a boundary of an area to be inspected for defects influential in a latent image to be formed in said photo-sensitive layer, having a width equal to or greater than a minimum width to be recognized by a pattern recognition device, and including plural portions arranged at intervals each narrower than the minimum width at a maximum resolution in a pattern transfer.

2. The reticle as set forth in claim 1, in which said plural portions of said discriminative pattern are non-transparent.

3. The reticle as set forth in claim 2, in which said plural portions are strips spaced from one another so as to expose said transparent substrate to gaps therebetween.

4. The reticle as set forth in claim 3, in which said gaps define said intervals.

5. The reticle as set forth in claim 4, in which said discriminative pattern is recognized by using an optical microscope, and said main pattern is transferred by using a reduction projection aligner.

6. The reticle as set forth in claim 2, in which said plural portions form a lattice so as to expose said transparent substrate to spaces defined in said lattice.

7. The reticle as set forth in claim 6, in which said space has a width less than said minimum width to be transferred at said maximum resolution in said pattern transfer.

8. The reticle as set forth in claim 7, in which said discriminative pattern is recognized by using an optical microscope, and said main pattern is transferred by using a reduction projection aligner.

9. The reticle used for a pattern transfer to a photosensitive layer according to claim 1, wherein said discriminative pattern is a line and space pattern.

10. The reticle used for a pattern transfer to a photosensitive layer according to claim 1, wherein a predetermined small pattern is used for forming said boundary, said predetermined small pattern not producing a latent usage in said resist.

* * * * *